United States Patent
Bothra et al.

[11] Patent Number: 6,034,434
[45] Date of Patent: Mar. 7, 2000

[54] OPTIMIZED UNDERLAYER STRUCTURES FOR MAINTAINING CHEMICAL MECHANICAL POLISHING REMOVAL RATES

[75] Inventors: Subhas Bothra; Milind G. Weling, both of San Jose, Calif.

[73] Assignee: VLSI Technology, Inc., San Jose, Calif.

[21] Appl. No.: 09/024,967

[22] Filed: Feb. 6, 1998

Related U.S. Application Data

[62] Division of application No. 08/594,874, Jan. 31, 1996, Pat. No. 5,783,488.

[51] Int. Cl.$^7$ .................................................. H01L 23/52
[52] U.S. Cl. ............................................. 257/758; 257/752
[58] Field of Search ................................ 257/750, 752, 257/758

[56] References Cited

U.S. PATENT DOCUMENTS

| | | | |
|---|---|---|---|
| 4,676,868 | 6/1987 | Riley et al. | 257/752 |
| 4,775,550 | 10/1988 | Chu et al. | 427/38 |
| 4,916,514 | 4/1990 | Nowak | 257/758 |
| 5,003,062 | 3/1991 | Yen | 437/231 |
| 5,089,442 | 2/1992 | Olmer | 437/238 |
| 5,278,105 | 1/1994 | Eden et al. | 437/250 |
| 5,461,010 | 10/1995 | Chen et al. | 437/228 |
| 5,470,802 | 11/1995 | Gnade et al. | 437/238 |
| 5,488,015 | 1/1996 | Havemann et al. | 437/195 |
| 5,494,853 | 2/1996 | Lur | 437/195 |
| 5,494,854 | 2/1996 | Jain | 437/195 |
| 5,510,293 | 4/1996 | Numata | 437/195 |
| 5,612,241 | 3/1997 | Jain | 257/752 |
| 5,618,757 | 4/1997 | Bothra et al. | 438/699 |

OTHER PUBLICATIONS

Ichikawa et al "Multilevel Interconnect system for 0.35 $\mu$m CMOS LST's With Metal Dummy Planization Process And Thin Tungsten Wiring" VMIC Conference, Jun. 27–29, 1995, pp. 254–260.

*Primary Examiner*—Gene M. Munson
*Attorney, Agent, or Firm*—Hickman & Martine, LLP

[57] ABSTRACT

A method of forming sharp oxide peaks on the surface of a semiconductor wafer for the purpose of conditioning polishing pads used during a Chemical Mechanical Polishing process is disclosed. In order to create oxide peaks on the surface of a wafer, additional elements are added to a trace layer of the wafer. An oxide layer is deposited over the additional elements using an Electron Cyclotron Resonance Chemical Vapor Deposition process, which includes a sputtering step, in order to create sharp peaks in the oxide layer over the additional lines. In some embodiments, the additional elements may be formed from a multiplicity of rectangular blocks over which pyramid-like oxide peaks are created. In others, they may be formed from a multiplicity of rectangular blocks connected by narrow lines over which pyramid-like oxide peaks and knife-edged peaks, respectively, are created.

10 Claims, 4 Drawing Sheets

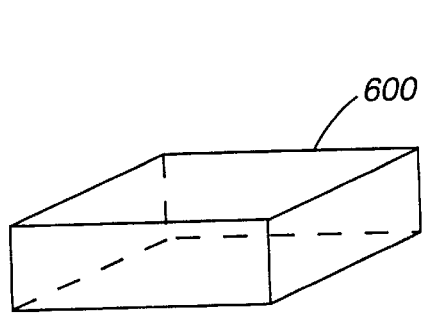
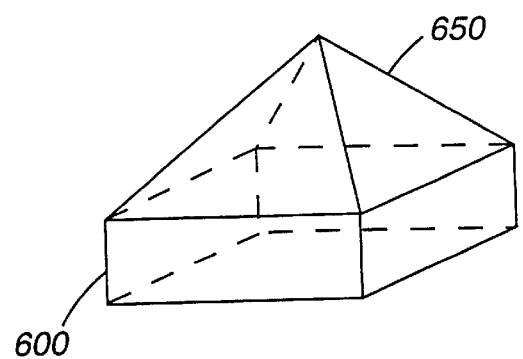
FIG. 4A
FIG. 4B
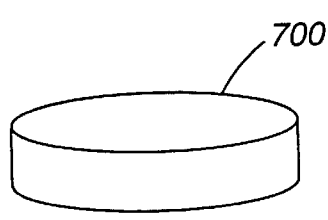
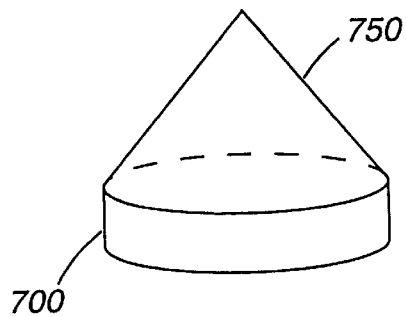
FIG. 5A
FIG. 5B
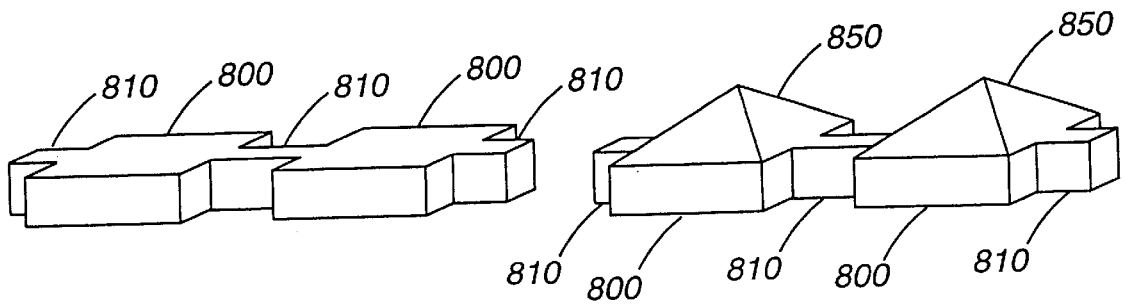
FIG. 6A
FIG. 6B

OPTIMIZED UNDERLAYER STRUCTURES FOR MAINTAINING CHEMICAL MECHANICAL POLISHING REMOVAL RATES

This is a Divisional application of prior application Ser. No. 08/594,874 filed on Jan. 31, 1996, U.S. Pat. No. 5,783,488, the disclosure of which is incorporated herein by reference.

BACKGROUND OF THE INVENTION

1. Field of Invention

The present invention relates generally to methods of fabricating integrated circuits. More particularly the use of Electron Cyclotron Resonance Chemical Vapor Deposition (ECR CVD) oxide films and optimized underlayer structures to maintain Chemical Mechanical Polishing (CMP) removal rates during fabrication is disclosed.

2. Description of the Prior Art

Maintaining the planarity of a semiconductor wafer surface during fabrication is crucial to ensure that there is no accidental coupling of active conductive traces between multiple active trace layers on integrated circuits housed on the wafer, and further to provide a surface with a constant height for any subsequent lithography processes. There are many processes which are intended to improve the planarity of a wafer surface during fabrication.

Chemical Mechanical Polishing (CMP) is one process which has been shown to have a high level of success in improving global, or long range, planarity. CMP has also been observed to improve the depth of focus margins for the lithography process. A typical CMP process involves the use of a polishing pad made from a synthetic material, such as polyurethane, and a polishing slurry which includes pH-balanced chemicals, such as sodium hydroxide, and silicon dioxide particles. Semiconductor wafers are mounted on a polishing fixture such that the wafers are held by a vacuum and pressed against the polishing pad under high pressure. The fixture then rotates and translates the wafers relative to the polishing pad. The polishing slurry assists in the actual polishing of the wafers. Ideally, the polishing pad has a rough surface, so the polishing slurry can flow between tiny crevices in the polishing pad and the surface of the wafer. While the pH of the polishing slurry controls the chemical reactions, e.g. the oxidation of the chemicals which comprise a passivation layer of the wafer, the size of the silicon dioxide particles controls the physical abrasion of surface of the wafer. The polishing of the wafer is accomplished when the silicon dioxide particles abrade away the oxidized chemicals.

Raised areas on the surface of a semiconductor wafer are the portions of the wafer which are polished during a CMP process. FIG. 1 is a diagrammatic illustration of the top view of a semiconductor wafer 10 which includes four integrated circuit chips 20. Each integrated circuit chip 20 has a plurality of active conductive traces 40 and is surrounded by a guard ring 30. The active conductive traces 40 are metal traces which are arranged to electrically couple associated elements of each integrated circuit 20. The active conductive traces 40, when covered with an insulating layer (not shown), form raised areas which make contact with a polishing pad. It should be appreciated that a typical integrated circuit includes a high density of active conductive traces. For illustrative purposes, the integrated circuit chips 20 shown in FIG. 1 have been simplified to include only a few active conductive traces 40. The guard rings 30 are typically metal lines which are formed around the perimeter of an integrated circuit. When an insulating layer (not shown) is deposited over the guard rings 30, raised areas are formed. Similarly, scribe lines 60, or lines on the surface of the semiconductor wafer 10 which mark the locations where the wafer 10 should eventually be cut to separate the integrated circuit chips 20, may also form raised areas when they are covered with an insulating layer (not shown).

In order for the CMP process to be consistent in planarizing the surface of a semiconductor wafer, the polishing pad used in the CMP process must be conditioned periodically. Conditioning allows polishing slurry to flow between the polishing pad and the surface of the wafer. The surface of the polishing pad needs to be mechanically abraded to maintain a consistent material removal rate during the CMP process. A polishing pad is conditioned by a conditioning disk, embedded with diamond tips, which is held down and rotated on the polishing pad which is being conditioned.

The use of diamond tips to condition the polishing pads used in the CMP process has been shown to be effective. However, conditioning a polishing pad after several wafers, i.e. one to ten, are polished is time consuming. The manufacturability of the CMP process would be improved with the development of a method which would reduce the frequency at which polishing pads must be conditioned.

SUMMARY OF THE INVENTION

To achieve the foregoing and other objects and in accordance with the purpose of the present invention, sharp peaks are added to the surface of a semiconductor wafer to condition the polishing pads used in the Chemical Mechanical Polishing (CMP) process in order to maintain a consistent material removal rate over several wafers. More specifically, in a method aspect of the invention, sharp peaks are added to the surface of a semiconductor wafer to enable the wafer itself to condition the polishing pad during the CMP process. Additional elements, as for example dummy lines, scribe lines, and guard rings, are added to an active trace layer of a semiconductor wafer in locations where sharp peaks are desired. In some embodiments, the additional elements may be created from the same metallic material as the active conductive traces on a trace layer of a wafer.

An Electron Cyclotron Resonance Chemical Vapor Deposition (ECR CVD) oxide layer is deposited over an active trace layer of a wafer. The ECR CVD process includes a sputter etching step which results in oxide peaks with sloped side walls being formed over the additional elements. If the underlying additional elements have at least one narrow surface dimension, as for example in the range of approximately 1 to 5 micrometers, the deposition of oxide material by ECR CVD results in sharp peaks being created in the oxide layer. In one preferred embodiment, the sharp peaks have side walls sloped at in the range of approximately 40 degrees to 50 degrees. A second oxide layer may be deposited over the sharp peaks, which are preserved in the second oxide layer. The actual shape of the sharp peaks is dependent upon the underlying structure of the additional elements. In some embodiments, the additional elements may be rectangular blocks over which pyramidal peaks may be formed in the oxide layer. In others, the additional elements may be cylindrical blocks over which conical oxide peaks may be formed, or they may be rectangular blocks interconnected by narrow lines over which pyramidal oxide peaks and oxide peaks with knife-like edges may be formed. In some embodiments, the density of the peaks may be in the range of up to approximately 500,000 to 10 million peaks per square centimeter.

In a first preferred embodiment, the sharp peaks used to mechanically abrade the surface of a polishing pad during the CMP process are pyramidal peaks, conical peaks, or peaks with knife-like edges. In a second embodiment, the sharp peaks, such as pyramidal peaks, conical peaks, or peaks with knife-like edges, may be formed over dummy additional elements during an ECR CVD deposition process. Integrated circuits formed using such a technique are also described.

BRIEF DESCRIPTION OF THE DRAWINGS

The invention, together with further objects and advantages thereof, may best be understood by reference to the following description taken in conjunction with the accompanying drawings in which:

FIGS. 4A and 4B are diagrammatic views of an additional element in the form of a rectangular block which can be added to an underlayer of a semiconductor wafer and a pyramidal peak which is created from an oxide layer deposited over the rectangular block in accordance with a first implementation of the second preferred embodiment of the present invention.

FIGS. 5A and 5B are diagrammatic views of an additional element in the form of a cylindrical block which can be added to an underlayer of a semiconductor wafer and a conical peak which is created from an oxide layer deposited over the cylindrical block in accordance with a second implementation of the second preferred embodiment of the present invention.

FIGS. 6A and 6B are diagrammatic views of an additional element in the form of rectangular blocks connected by narrow lines which can be added to an underlayer of a semiconductor wafer and pyramidal peaks which are created from an oxide layer deposited over the rectangular blocks in accordance with a third implementation of the second preferred embodiment of the present invention.

DETAILED DESCRIPTION OF THE INVENTION

The present invention will now be described in detail with reference to a few preferred embodiments thereof as illustrated in the accompanying drawings. Referring initially to FIG. 2, there are shown sharp peaks which may be added to the surface of a semiconductor wafer for the purpose of mechanically abrading the polishing pad used in a Chemical Mechanical Polishing (CMP) process in accordance with a first preferred embodiment of the current invention. Chemical Mechanical Polishing (CMP) has been observed to have a high level of success in improving global planarity on the surface of a semiconductor wafer. The CMP process involves the use of a polishing pad made from a synthetic material, such as polyurethane, and a polishing slurry to polish semiconductor wafers mounted on a polishing fixture.

Adding sharp peaks to the surface of a semiconductor wafer enables the wafer itself to condition the polishing pad during the CMP process. The sharp peaks serve to abrade the polishing pad, thereby maintaining the roughness necessary on the polishing pad for the CMP process to maintain a consistent material removal rate.

Figure 1:
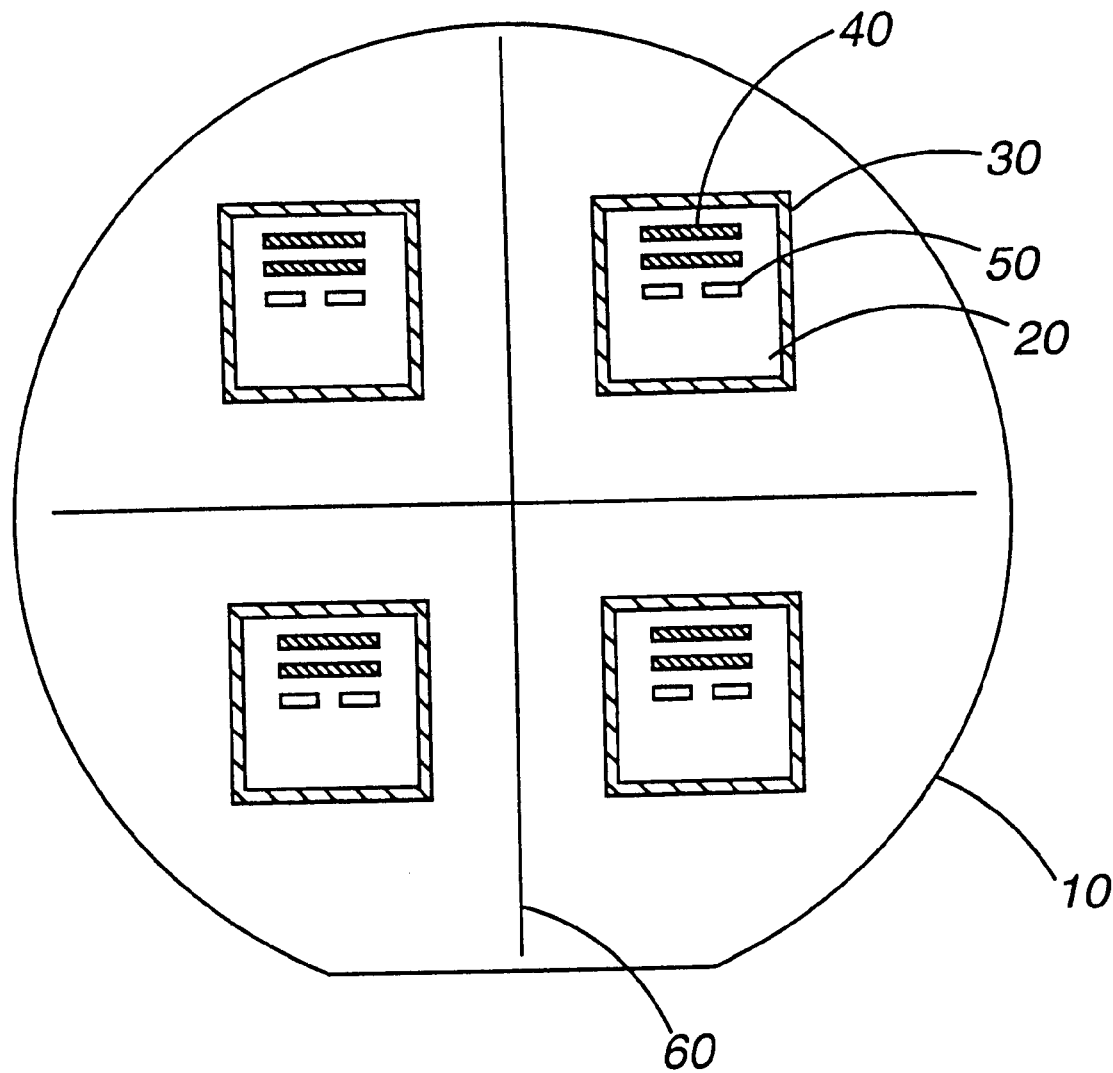
FIG. 1 is a diagrammatic top view of a semiconductor wafer.
Figure 2A:
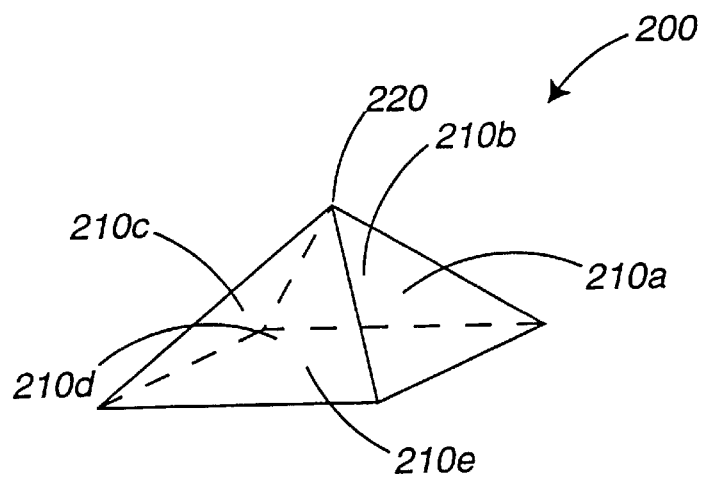
FIGS. 2A–C are diagrammatic illustrations of a structures which may be added to the surface of a semiconductor wafer during fabrication in accordance with a first preferred embodiment of the present invention.

FIG. 2A is an illustration of a pyramid-like peak 200 which has four triangular faces 210a, 210b, 210c, 210d and a four-sided polygonal base 210e. The four triangular faces 210a, 210b, 210c, 210d meet at an apex 220. The apex 220 provides a sharp point which emulates the tip of a diamond, which is the material commonly used to mechanically abrade the surface of a polishing pad. The apex 220 of the pyramid-like peak 200 formed on the surface of a semiconductor wafer enables the apex 220 to roughen the surface of a polishing pad during the CMP process.

Figure 2B:
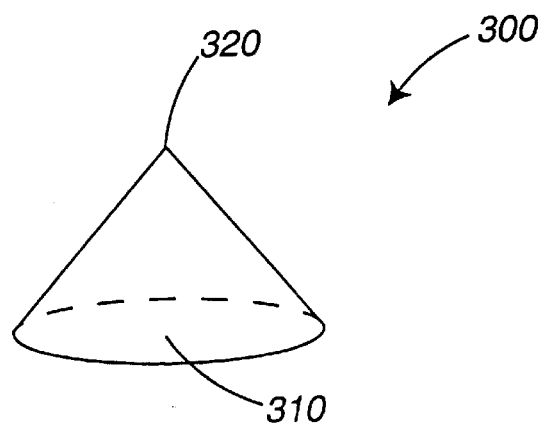

Similarly, FIG. 2B is an illustration of a conical peak 300 which is characterized by an ellipsoidal base 310 (circular in this figure). Every cross-section of the conical peak 300 taken in the same plane as the ellipsoidal base 310 has the same ellipsoidal shape as the base 310. The conical peak 300 has an apex 320 which provides a sharp point which, when the peak 300 is formed on the surface of a semiconductor wafer, serves to roughen the surface of a polishing pad during the CMP process.

Figure 2C:
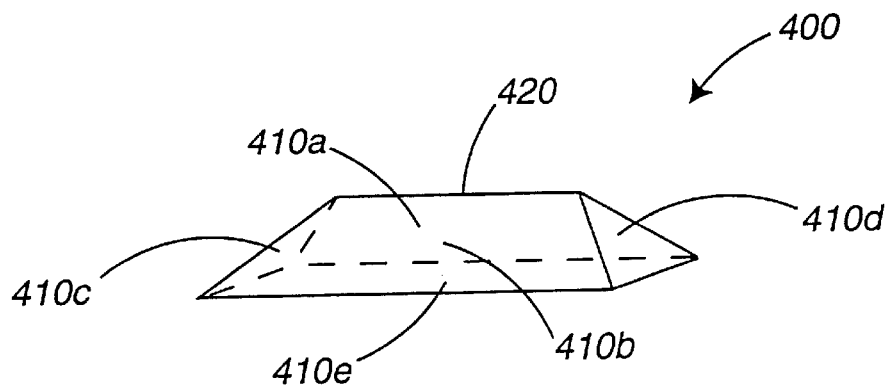

FIG. 2C is an illustration of a long-edged peak 400 characterized by two trapezoidal faces 410a and 410b which intersect to form a knife-like edge 420. The long-edged peak 400 also includes two triangular faces 410c and 410d, as well as a four-sided polygonal base 410e. During the CMP process, a long-edged peak 400 with a knife-like edge formed on the surface of a semiconductor wafer will cut and abrade the polishing pad during the CMP process, thereby conditioning the polishing pad.

Since the planarity of a semiconductor wafer during fabrication is crucial, any sharp peaks, i.e. sharp points and edges, added to the wafer to abrade the polishing pad surface during the CMP process must be eliminated once the CMP process is complete, before the fabrication process continues. Since the layer of the semiconductor being polished during CMP is an insulating layer, forming the peaks out of the same material as used in the insulating layer would enable the peaks to be removed during CMP, while allowing the peaks to abrade the polishing pad. In typical semiconductors, the insulating layer is an oxide layer. As such, the oxide peaks developed in an oxide layer of a semiconductor wafer would abrade the polishing pad used during CMP without compromising the overall planarity of the wafer.

Figure 3A:
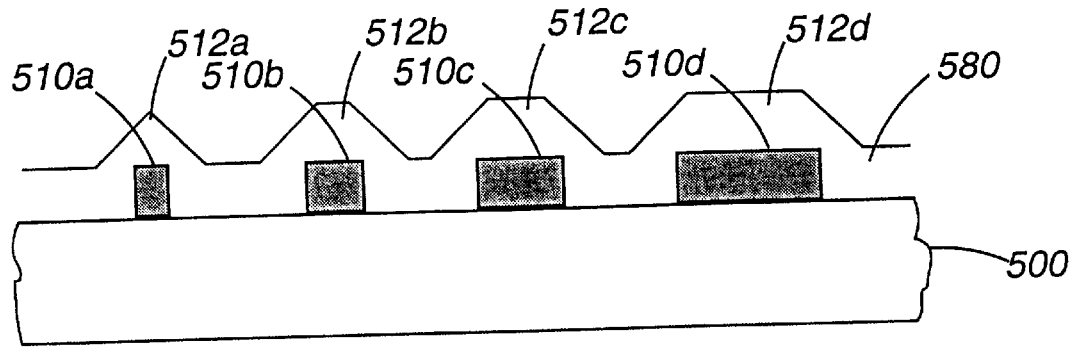
FIGS. 3A–C are diagrammatic side views of a semiconductor wafer segment which illustrate the steps in creating raise oxide peaks in accordance a second preferred embodiment of the present invention.
Figure 3B:
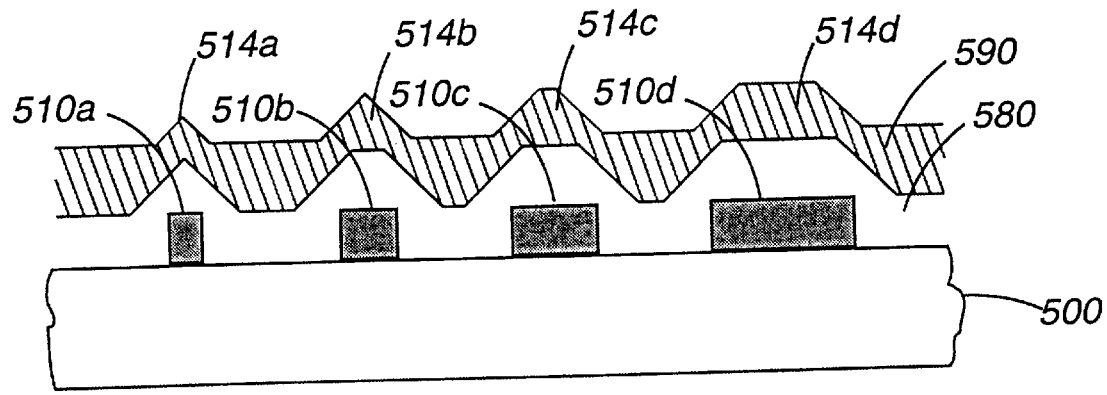
Figure 3C:
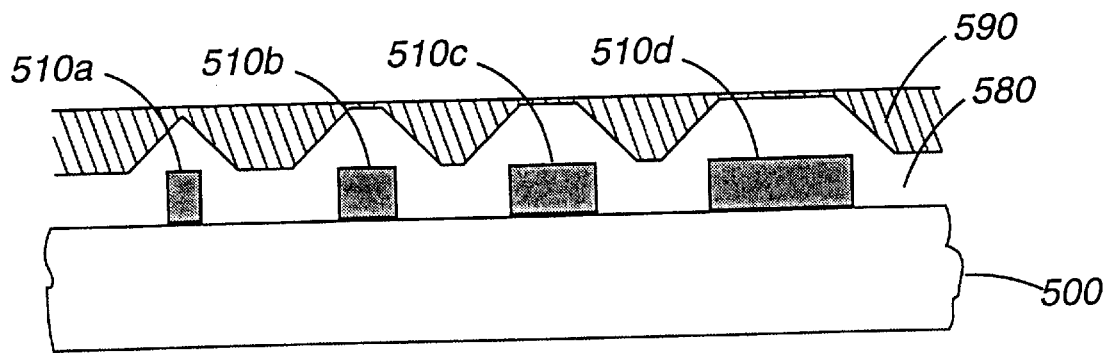

Referring next to FIGS. 3A–C, a method for forming peaks in an oxide layer of a semiconductor wafer substrate in accordance with a second embodiment of the present invention will be described. FIGS. 3A–C are diagrammatic side views of a semiconductor wafer substrate in accordance with a second preferred embodiment of the present invention. A semiconductor wafer substrate 500 upon which additional elements 510 are situated is shown in FIG. 3A. The additional elements 510 are generic representations of elements which may include traces, dummy lines, guard rings, and scribe lines. Dummy lines are typically metal lines which are added to a semiconductor wafer substrate 500 for the main purpose of aiding in improving the surface planarity of the semiconductor wafer substrate 500. Dummy lines may be interspersed among active conductive traces (not shown) which electrically couple elements associated with integrated circuits (not shown) on a semiconductor wafer substrate 500. Guard rings are used in part to define the periphery of integrated circuits (not shown) on a semiconductor wafer substrate 500, and are typically continuous lines. Scribe lines are used during the semiconductor fabrication process primarily for alignment purposes. They are also used to define the locations on a wafer which must be cut in order to form individual integrated circuits. In this embodiment, the additional elements 510 are dummy lines which are added to the surface of the substrate 500 to serve two purposes. One purpose is to aid in the formation of peaks used to condition the polishing pads used in the CMP process. The other purpose is to aid in achieving planarity on the surface of the substrate 500.

A first oxide layer 580, which serves as an insulating layer, is deposited over the additional elements 510 both to insulate the additional elements 510 and to fill in the gaps 550 between the additional elements 510. Filling in the gaps 550 is necessary in order to create a planar surface on the semiconductor wafer 550. As the gaps 550 fill, raised oxide peaks 512 are created in the first oxide layer 580 over the additional elements 510.

For the embodiment shown, the first oxide layer 580 is an Electron Cyclotron Resonance Chemical Vapor Deposition (ECR CVD) oxide film layer. ECR CVD oxide films have been shown to have excellent sub-micron gap fill properties. In addition to having excellent sub-micron gap fill properties, ECR CVD oxide films can be used to aid in conditioning the polishing pads used in the CMP process as it is possible to form geometric shapes in the oxide film for use in abrading the polishing pads. An ECR CVD oxide deposition process is used to deposit and form geometric shapes in the ECR CVD oxide film layer 580.

An ECR CVD oxide deposition system uses a microwave cavity in which a high density plasma of argon and oxygen ions is created under electron cyclotron resonance conditions. The argon and oxygen ions are introduced into a reaction chamber in which a semiconductor wafer, with a surface containing active conductive traces and additional elements, is housed. At this point in the process, the surface of the semiconductor wafer is covered with an ECR CVD oxide film, thus creating raised oxide areas over the additional elements and active conductive traces on the wafer. Silane is then injected into the reaction chamber. The oxygen ions in the reaction chamber react with the silane to form silicon dioxide on the surface of the wafer. A radio frequency voltage bias in the range of approximately 300 khz to 20 Mhz, as for example 13.56 Mhz, is applied to the wafer in order to accelerate the argon ions in the plasma towards the wafer. The argon ions in the reaction chamber perform the sputter etching component of the process which prevents pinch-off of the gaps between additional elements and active conductive traces on the surface of the semiconductor wafer during ECR CVD oxide deposition. The sputter etch process occurs when the argon ions come into contact with the raised oxide areas on the wafer surface, and result in oxide material being removed from the corners of the raised oxide areas. The removal of oxide material during the sputter etch process results in angled slopes of in the range of approximately 40 degrees to 50 degrees, as for example 45 degrees in this embodiment, on the sides of the raised oxide areas. Of course, the actual slope of the sides of the raised oxide areas may be varied widely by controlling the various process variables involved with the ECR CVD oxide deposition process.

The semiconductor wafer substrate 500 is shown after an ECR CVD oxide deposition process has occurred. The raised oxide peaks 512, herein referred to as angled oxide peaks 512 (with sides angled at 45 degrees in this embodiment), are created as a result of the sputter etching component of the ECR CVD oxide deposition process. If the additional elements 510 in the underlying topography of the semiconductor wafer substrate 500 are carefully laid out, they can be used to form specialized peaks as previously described with reference to FIG. 2. The actual size and the shape of the angled oxide peaks 512 in the ECR CVD oxide film layer 580 is determined by the size and the shape of the additional elements 510, the thickness of the ECR CVD oxide film layer 580, and the length of the deposition process. An additional element with one relatively large dimension and one narrow dimension, as for example additional element 510*d*, may create an oxide peak 512*a* which has a top which is a long edge. An additional element with two relatively narrow dimensions, as for example additional element 510*a*, may create an oxide peak 512*a* with a top which is a point instead of a true edge. For any given thickness of an insulating layer, as the width of one surface dimension of an additional element increases while the other surface dimension remains in the range of approximately 1 to 5 micrometers, the width of the corresponding dimension of the top of the oxide peak created over the additional element increases. Conversely, as the width of one surface dimension of an additional element decreases while the other dimension remains in the range of approximately 1 to 5 micrometers, the width of the corresponding dimension of the top of the oxide peak over the additional element decreases, until a threshold is reached at which point the corresponding dimension of the top of the oxide peak cannot decrease any further. Once this threshold is reached, as the dimension of the additional element decreases, the height of the corresponding oxide peak decreases.

In this embodiment, a second insulating layer 590 is deposited over the first oxide layer 580, as shown in FIG. 3B. The second insulating layer 590 is a second oxide layer. The oxide peaks 514 formed from the second oxide layer 590 overlay the oxide peaks 512 formed from the first oxide layer 580. The oxide peaks 514 in the second oxide layer 590 are the peaks which are used to optimally abrade the polishing pads used in the CMP process. In this embodiment, the second oxide layer 580 is not subjected to an ECR CVD oxide deposition process.

FIG. 3C is a diagrammatic illustration of the surface of the semiconductor wafer substrate 500 after a CMP process. The wafer substrate 500 is planar, as the oxide peaks 514 have been removed during the course of the CMP process.

Although the hardness factor of diamonds, which are typically used to condition the polishing pads used in the CMP process, is higher than that of oxide materials such as ECR CVD silicon dioxide on the Mohr's scale of hardness, the oxide peaks have sufficient hardness to effectively abrade the polishing pads, which are commonly made of plastic materials. As long as the oxide peaks have sharp points or edges, they will serve to abrade the polishing pads used in the CMP process.

The density of the oxide peaks on the surface of a semiconductor wafer may vary depending upon the type of additional element over which they are formed. For example, additional elements which are dummy lines are typically placed in wide open spaces on the surface of a semiconductor wafer. As such, there is room for a multitude of oxide peaks to be created. It follows that the density of the oxide peaks created over the dummy lines may be high, as for example in the range of up to approximately 10 million peaks per square centimeter. The density of oxide peaks formed over scribe lines tends to be lower, however, and may be in the range of up to approximately 500,000 to 1 million peaks per square centimeter. On the other hand, the peaks formed over guard rings may be placed such that there is approximately one peak every 8 to 10 micrometers along the overall length of a guard ring. In general, the density of the oxide peaks is in the range of up to approximately 500,000 to 10 million peaks per square centimeter.

FIGS. 4A and 4B are diagrammatic views of a first structure of an additional element in an underlayer of a semiconductor wafer and the peak created in an oxide layer over the structure, respectively, in accordance with the second embodiment of the present invention. Additional elements on a trace layer of a semiconductor wafer may be formed into rectangular blocks. An illustration of a rectangular block 600 is shown in FIG. 4A. FIG. 4B is an illustration of a pyramidal oxide peak 650 which is formed over the rectangular block 600 after an ECR CVD oxide deposition process. If one dimension of the rectangular block 600 were particularly long, the corresponding dimension for the peak formed in the oxide layer over the rectangular block 600 would also be long. The peak may then take the shape of the peak previously described with respect to FIG. 2C.

FIGS. 5A and 5B are diagrammatic views of a second structure of an additional element in an underlayer of a semiconductor wafer and the peak created in an oxide layer over the structure, respectively, in accordance with the second embodiment of the present invention. Additional elements on a trace layer of a semiconductor wafer may be formed into cylindrical blocks which have ellipsoidal cross-sections. An illustration of an ellipsoidal cylindrical block 700 is shown in FIG. 5A. FIG. 5B is an illustration of a conical oxide peak 750 which is formed over the ellipsoidal cylindrical block 700 after an ECR CVD oxide deposition process.

FIGS. 6A and 6B are diagrammatic views of a third structure of an additional element in an underlayer of a semiconductor wafer and the peaks created in an oxide layer over the structure, respectively, in accordance with the second embodiment of the present invention. This particular structure for an additional element corresponds particularly well with guard rings and scribe lines, since guard rings and scribe lines tend to be continuous, and longer than typical dummy additional elements. FIG. 6A is a diagrammatic illustration of rectangular blocks 800 connected by narrow lines 810. Pyramidal peaks 850 are formed from the oxide layer over the rectangular blocks 800 as shown in FIG. 6B. Depending upon the dimensions of the narrow lines 810, peaks (not shown) may also be formed in the oxide layer directly over the narrow lines 810. The use of blocks of any shape, as for example rectangular blocks 800 in this embodiment, connected by narrow lines 810 works especially well for guard rings and scribe lines as both are relatively long, thereby enabling a series of sharp peak to be formed.

Although only a few embodiments of the present invention have been described, it should be understood that the present invention may be embodied in many other specific forms without departing from the spirit or the scope of the invention. In particular, additional peaks in an oxide layer, or more generally an insulating layer, may be formed for use with any polishing process which may benefit from a semiconductor with a jagged surface. While only a few geometric underlayer structures used to form oxide peaks have been described, it should be clear that other geometric structures may be implemented as well. Other possible geometric structures include, triangular underlayer structures (which may form tetrahedral oxide peaks) and assorted other polygonal underlayer structures, arcular underlayer structures, and pointed underlayer structures which may create spikes in an oxide layer. It should be clear that although the underlayer structures disclosed for the formation of guard rings in the present invention are rectangular blocks connected by narrow lines, the rectangular blocks may be replaced by ellipses and polygons in general. It should also be clear that although a narrow surface dimension in the range of approximately 1 to 5 micrometers has been specified for the underlayer structures, the range may be adjusted as necessary to create a sharp peak of a desired size and shape. It follows that although a range for the density of the sharp peaks on the surface of a wafer has been specified in terms of the number of peaks per unit area, the density may vary as the size of the peaks varies.

Although the present invention has only been described with respect to creating oxide peaks over underlying additional elements, it should be appreciated that oxide peaks may also be created over active conductive traces. In cases where additional elements are not added to the surface of a wafer undergoing an ECR CVD process, any oxide peaks which may be formed will only be formed over the active conductive traces. It should be clear that the oxide peaks created over underlying active conductive traces would, like oxide peaks created over underlying additional elements, serve to abrade polishing pads used in the CMP process.

An ECR CVD oxide deposition system has been described as using argon ions to provide the sputter etching component of the deposition process. As will be appreciated by those skilled in the art, any ions which can etch an insulating layer of a semiconductor wafer as specified may be utilized. In fact, any deposition process which includes a sputter etching component, as for example a multi-step deposition and etch process which involves a cycle of deposition and sputter etching steps, may be utilized in place of an ECR CVD deposition process.

Although a specific range for the radio frequency voltage bias which accelerates argon ions in the ECR CVD oxide deposition process has been described with respect to the present invention, it should be clear that any radio frequency voltage bias which accelerates the ions which provide the sputter etching component, argon or otherwise, of the process may be used. Similarly, if the ECR CVD oxide deposition process is adjusted, it may be desirable to adjust the slope of the sharp peaks. Although the slope of the sharp peaks has been specified as being in the range of approximately 40 degrees to 50 degrees, adjusting the range does not represent a departure from the spirit or the scope of the present invention. Therefore, the present examples are to be considered as illustrative and not restrictive, and the invention is not to be limited to the details given herein, but may be modified within the scope of the appended claims.

We claim:

1. A semiconductor wafer, having at least one integrated circuit, comprising:

a substrate;

a multiplicity of active conductive traces on the substrate of the wafer, the active conductive traces each being arranged to electrically couple associated elements of an associated integrated circuit on the wafer, there being gaps between adjacent ones of the traces;

a multiplicity of additional elements on the substrate, wherein the additional elements are not arranged to electrically couple any elements in the integrated circuit, wherein the additional elements have at least one narrow surface dimension, the narrow surface dimension being in the range of approximately 1 to 5 micrometers; and, an insulating layer formed over the active conductive traces and the additional elements, the insulating layer having a multiplicity of sharp peaks formed therein, the insulating layer having a density of sharp peaks in the range of up to approximately 500,000 to 10 million sharp peaks per square centimeter.

2. A wafer according to claim 1 wherein the additional elements are formed from at least one element selected from the group consisting of a multiplicity of ovals, a multiplicity of polygons, and a multiplicity of lines, wherein the elements each have at least one narrow surface dimension.

3. A wafer according to claim 2 wherein the multiplicity of ovals and the multiplicity of polygons are interconnected by narrow lines.

4. A wafer according to claim 2 wherein the narrow surface dimension is in the range of approximately 1 to 5 micrometers.

5. A wafer according to claim 1 further comprising a multiplicity of guard rings on the substrate of the wafer, the guard rings being arranged such that there is at least one guard ring around the perimeter of each integrated circuit, wherein the guard rings are formed from narrow lines with enlarged pads, wherein the pads are selected from the group consisting of a multiplicity of ovals and a multiplicity of polygons, the pads being sized such that sharp peaks are formed over the pads after the first insulating layer etching and second insulating layer depositing steps.

6. A wafer according to claim 1 further comprising a multiplicity of scribe lines on the substrate of the wafer, wherein the scribe lines are formed at least partially from elements selected from the group consisting of a multiplicity of ovals, a multiplicity of polygons, and a multiplicity of lines, wherein the elements each have at least one narrow surface dimension in the range of approximately 1 to 5 micrometers.

7. An integrated circuit comprising:

a substrate;

a multiplicity of active conductive traces formed on the substrate, the active conductive traces each being arranged to electrically couple associated elements of an associated integrated circuit on the wafer, there being gaps between adjacent ones of the traces;

a multiplicity of additional elements formed on the substrate, wherein the additional elements are not arranged to electrically couple any elements in the integrated circuit, wherein the additional elements have at least one narrow surface dimension, the narrow surface dimension being in the range of approximately 1 to 5 micrometers; and, an insulating layer formed over the active conductive traces and the additional elements, the insulating layer having a multiplicity of sharp peaks formed therein, the insulating layer having a density of sharp peaks in the range of approximately 500,000 to 10 million sharp peaks per square centimeter.

8. An integrated circuit according to claim 7 wherein the additional elements are formed from at least one selected from the group consisting of a multiplicity of ovals, a multiplicity of polygons, and a multiplicity of lines, wherein the elements each have at least one narrow surface dimension.

9. A method as recited in claim 8 wherein the multiplicity of ovals and the multiplicity of polygons are interconnected by narrow lines.

10. An integrated circuit according to claim 8 wherein the narrow surface dimension is in the range of approximately 1 to 5 micrometers.

* * * * *